United States Patent
Grohmann et al.

(10) Patent No.: US 6,918,061 B2
(45) Date of Patent: Jul. 12, 2005

(54) ELEMENT FOR CARRYING OUT A PROGRAM OR TEST SEQUENCE

(75) Inventors: Dieter Grohmann, Gechingen (DE); Nico Hartmann, Sindelfingen (DE); Hermann Schmid, Aalen (DE)

(73) Assignee: DaimlerChrysler AG, Stuttgart (DE)

( * ) Notice: Subject to any disclaimer, the term of this patent is extended or adjusted under 35 U.S.C. 154(b) by 418 days.

(21) Appl. No.: 09/919,610

(22) Filed: Aug. 1, 2001

(65) Prior Publication Data

US 2003/0050771 A1 Mar. 13, 2003

(30) Foreign Application Priority Data

Aug. 1, 2000 (DE) .......................................... 100 37 396

(51) Int. Cl.$^7$ ................................................ G06F 11/00
(52) U.S. Cl. .............................. 714/40; 700/26; 703/20; 703/21
(58) Field of Search ....................... 700/26; 703/19–21; 714/40

(56) References Cited

U.S. PATENT DOCUMENTS

| | | | | |
|---|---|---|---|---|
| 3,921,146 A | * | 11/1975 | Danco | 703/21 |
| 4,748,553 A | * | 5/1988 | Itoh et al. | 700/26 |
| 5,592,655 A | * | 1/1997 | Takamine et al. | 703/16 |
| 6,009,539 A | * | 12/1999 | Ranson | 714/30 |
| 6,560,569 B1 | * | 5/2003 | Abu El Ata | 703/2 |
| 6,625,783 B2 | * | 9/2003 | Yamanaka | 716/3 |
| 6,697,995 B1 | * | 2/2004 | Yoon | 714/799 |
| 2001/0032025 A1 | * | 10/2001 | Lenz et al. | 700/28 |
| 2002/0188432 A1 | * | 12/2002 | Houlihane et al. | 703/20 |

OTHER PUBLICATIONS

Mano, M. Morris, and Charles R. Kime, Logic and Computer Design Fundamentals, 1997, Prentice–Hall Inc., Chapter 4.*

* cited by examiner

*Primary Examiner*—Robert Beausoliel
*Assistant Examiner*—Michael Maskulinski
(74) *Attorney, Agent, or Firm*—Crowell & Morning LLP

(57) ABSTRACT

An element for carrying out and documenting a program or test sequence allows specific functions to be carried out. The element has at least one control input to which an external control signal can be supplied, and a variable can be varied in the element as a function of the external control signal. The process of carrying out a particular function can be varied by the element in such a manner that, when the variable has a specific value ("0") and the external control signal is at a first signal level, the variable assumes a value (not equal to "0") which differs from the specific value; and when the variable is at that specific value and an external control signal which is at the first signal level is once again applied, the variable remains at that specific value.

18 Claims, 12 Drawing Sheets

ELEMENT FOR CARRYING OUT A PROGRAM OR TEST SEQUENCE

BACKGROUND AND SUMMARY OF THE INVENTION

This application claims the priority of German patent document 100 37 396.8, filed Aug. 1, 2000, the disclosure of which is expressly incorporated by reference herein.

The invention relates to an element for carrying out and documenting a program or test sequence in, for example, a motor vehicle.

Technical systems such as are used in vehicles are characterized by a range of characteristics, and are complex, being composed of components that interact via communications links, such as bus systems. Furthermore, such systems are heterogeneous, at least with regard to their interaction. Control systems are provided, in the same way as in reactive systems. Combinations of both types of systems likewise exist. Furthermore, these systems are hybrid. Electrical, mechanical, hydraulic, optical and/or pneumatic components thus occur.

Both open-loop and closed-loop control of such systems is provided by specific control components, which are a part of the systems. In vehicles, these components are referred to as controllers, which are normally electronic components, whose function is coded in a program that is carried out in a computation unit.

These complex technical systems must be tested, for quality assurance purposes, particularly the controllers which, in the end, provide the monitoring for the technical processes. The program or test systems used in this case are intended to provide the capability to influence all those variables which are relevant for the test at the interface with the control component or control components, and also to make these variables visible when required (test, program sequence, simulation and recording)

For controller testing, the controller is simulated in a simulated technical environment (software-in-the-loop SIL) in the early development phases. As soon as the control components are actually available, the test of the complete component is continued on a hardware-in-the-loop (HIL) test system. Those components which belong to the complete control system are also tested linked together using such HIL test systems. In the final step, the controllers are integrated and tested once again jointly with the other components that make up the overall system.

One object of the present invention is to simplify and improve the testing of such controllers.

According to the invention, this object is achieved by the use of simulation elements which allow specific functions to be carried out. The element has at least one control input to which an external control signal can be supplied, and a variable can be varied in the element as a function of the external control signal. The process of carrying out the function can be varied by the element in such a manner that when the variable has the value "0" and the external control signal is at a first signal level, the variable assumes a specific value not equal to "0"; and when the variable is at that specific value and an external control signal which is at the first signal level is once again applied, the variable remains at that specific value.

It has been found that a simulation and test can be carried out easily using elements such as these. These elements can easily be provided with appropriate parameters, so that said parameters can then be matched to the respective specific cases.

The linking of such elements allows even complex systems to be simulated, documented, run and/or tested. Different elements with different functions are advantageously provided for this purpose. It can be found that the number of these elements can be limited while nevertheless allowing even complex simulations to be carried out with comparatively little effort.

In one embodiment of the invention, the variable is reset to the value "0" when the element has finished carrying out the function. When the variable is reset, the element outputs an external control signal, which is at the first signal level, via at least one control output of the element. This advantageously allows elements to be linked in series. The individual elements can then initiate further action by outputting appropriate external control signals once they have completed their own function.

In another embodiment of the invention, the variable assumes the value "0" when the at least one control input of the element is supplied with an external control signal which is at a second signal level, with an external control signal which is at the second signal level then being output via the at least one control output of the element. This allows deactivation to passed on from the element. Thus, overall, the element can remain in an activated state and can carry out the function until deactivated by an appropriate external control signal. On the other hand, the element can deactivate itself when it has completed its function.

There is advantageously no restriction to carrying out just one element at one time. Parallel-running processes can thus also advantageously be simulated.

In still another embodiment of the invention, the element has one control input and a number of control outputs, with the external control signal being output from the element via all the control outputs. Such an element advantageously makes it possible to initialize the process of carrying out the simulation of parallel-running processes.

In a further embodiment of the invention, the element has a number of control inputs, with an external control signal which is at the first signal level being output via the at least one control output when a control signal which corresponds to the first signal level is applied to all the control inputs. This element allows the activation of a downstream element which is stimulated via the control output of this element to be controlled such that this activation takes place only when an activation signal is applied to all the control inputs. This thus represents a logic AND operation.

The element in another embodiment of the invention has a number of control inputs, with an external control signal which is at the first signal level being output via the at least one control output when a control signal which corresponds to the first signal level is applied to at least one control input. In contrast to the previous embodiment, it has a logic OR operation.

In still another embodiment of the invention, the element has one control input and a number of control outputs as well as at least one data input. An external control signal, which is applied to the control input and is at the first signal level, is output via that control output which is determined by the function of the element as a function of the signal which is applied to the at least one data input. This advantageously makes it possible for the further program sequence, in particular a test sequence, to branch depending on whether specific states and data values are reached.

In yet another embodiment of the invention, the element has one or more data inputs and one or more data outputs, in which case the function comprises the formation of one or more data output signals from the data input signals which are applied to the data input or inputs, which data output signal or signals is or are output via the data output or outputs. In this case, the data input signals can in the simplest case be passed on unchanged via the data outputs. These data input signals can likewise also be modified. This may be done, for example, by arithmetic operations such as addition, subtraction, multiplication and division. It is likewise also possible to form the absolute value, to carry out integration or differentiation, or to provide transcendental functions. The function may likewise also comprise the assessment of the data input signals by means of Boolean algebra, using NOT, AND, OR and XOR operations.

It is also possible for the function to represent a comparison, which may include the values of a number of data input signals. One or more data input signals may likewise be investigated to determine whether they are within a specific value range. It is also possible to investigate the change in the data input signal by, for example, using the comparison process to investigate whether the respective data input signal is above or below a threshold. Such a comparison element advantageously does not output any external control signal. The element carries out the comparison function once it has received an external control signal at the first signal level via a control input. The comparison process is then ended when an appropriate external control signal for deactivation is applied via the control input.

The function may also comprise the storage of specific values. This may be, for example, the final value of the data input signal, the minimum value which the data input signal has assumed, the maximum value which the data input signal has assumed, or the mean value of the data input signal.

According to a further feature of the invention, the function of the element is a time measurement. The element may have, for example, at least one data input such that, once the element has been activated by an external control signal, the time period is determined which passes before a specific further data input signal occurs after a specific first data input signal.

According to another embodiment of the invention, time measurement may be carried out by measuring a specific time period starting from a time defined by the application of an external control signal at the first signal level or by a specific signal at a data input or by a signal combination at a number of data inputs of the element, with an external control signal at the first signal level being output at the end of the time period via a control output of the element, and/or a corresponding data signal being output at one or more data outputs. A refinement such as this represents a time-related count down, in particular a time-out element.

According to another feature of the invention, the element can be supplied with an external control signal via a control input, with a time signal profile being output as the data output signal via a data output when the external control signal is at the first signal level. In this case, various functions can be provided by an appropriate logic operation on basic functions.

It has advantageously been found that the described elements make it possible to provide test systems which allow an automated sequence or test. In particular, it is thus no longer necessary to check the large number and complexity of control functions by manual testing, which is problematic in any case from the viewpoints of effectiveness and efficiency.

The elements according to the invention allow both the simulation and the recording and evaluation of variables which are relevant for the test or the software. This is done by simulation of the component under test or of the system under test, with subsequent evaluation of the corresponding reactions.

It has furthermore been found that simulation and evaluation are possible in real time. In addition, it has been found that a program system or test system which comprises the described elements is also able to carry out a number of functions at the same time. Furthermore, both digital variables and analogue variables can be processed by appropriate configuration of the elements.

Two methods are known, in conjunction with computer-aided simulation, from the prior art. One relates to compilation, which requires that the program be translated to a machine-legible form before the running time. The machine-legible form can then in turn be run only on the machine for which this machine-legible form was compiled. Furthermore, interpretation is known, in which the program is analysed and carried out during the running time. This has disadvantages with regard to the running times which can be achieved.

The combination of the elements proposed here means that the elements can be matched to the specific conditions by pre-setting appropriate parameters. Firstly, this allows good flexibility to be achieved. Nevertheless, the simulation running times are sufficiently fast, and the simulations can also be carried out in a flexible manner on different computers.

Other objects, advantages and novel features of the present invention will become apparent from the following detailed description of the invention when considered in conjunction with the accompanying drawings.

DETAILED DESCRIPTION OF THE DRAWINGS

Figure 1:
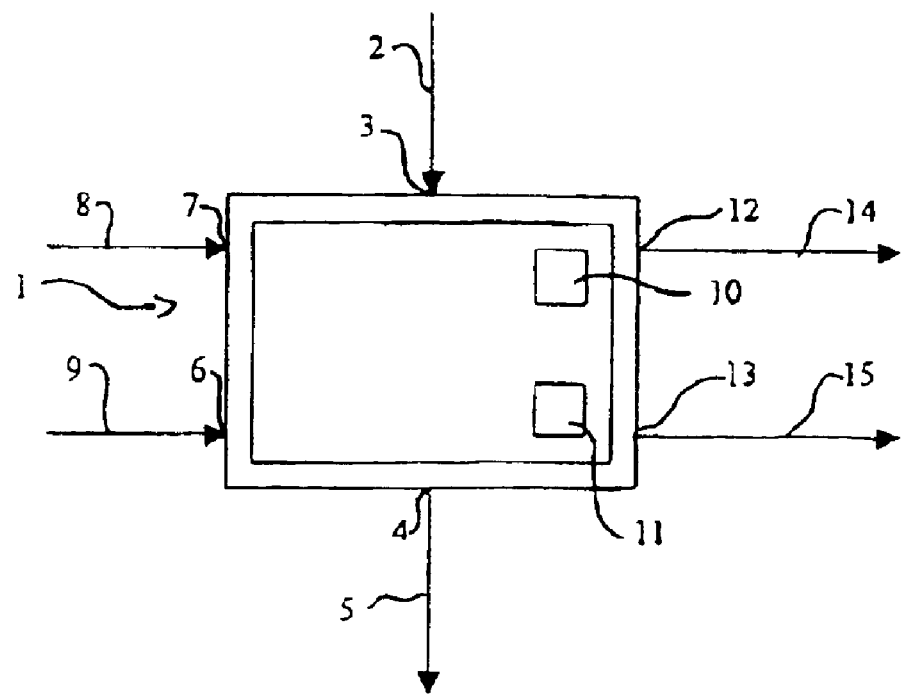
FIGS. 1 to 17 show various elements whose combination and linking allow various simulation and test tasks to be carried out.

In the overall system, a distinction is drawn between controlling elements and storage elements. Controlling elements 1 carry out a clearly delineated function. FIG. 1 shows the fundamental structure of a controlling element 1. An external control signal 2 is supplied to the controlling element 1, via a control input 3, as a control flow. Furthermore, a control output 4 can be seen, via which an external control signal 5 can be output from the controlling element 1.

In addition, data inputs 6 and 7 can be seen, via which data input signals 8 and 9 can be supplied.

The reference number 10 denotes a variable which assumes a specific value not equal to 0, depending on whether the element 1 is in the activated or deactivated state, or has the value 0 when the element 1 is deactivated.

The reference number 11 denotes a parameter or parameters which can be preset for the controlling element 1 and which the controlling element 1 can access while carrying out its function. A parameter cannot be varied during the time in which a controlling element 1 is activated.

The controlling element 1 also has data outputs 12 and 13, via which the data output signals 14 and 15 can be output. The processed data can be made available to other elements via these data outputs. These data flows thus transport values or events, that is to say data signals, which represent specific states. The variables transported by the data flows may vary with time.

Controlling elements can be linked to one another in order to carry out complex tasks. The linking process can be carried out both via monitoring flows, that is to say via the external control signals to the control inputs and control outputs, and via the data flows, that is to say via the data input and data output signals.

The controlling elements can be subdivided into two groups:
- Monitoring elements, which monitor the process of passing on external control signals, and hence the activation and deactivation of controlling elements; and
- Data-processing elements, which simulate and monitor variables which are provided by the test system.

Sequence control is carried out via the external control signals 2, 5 and via the variable 10. Each controlling element 1 has one, and only one, variable 10, which indicates the activation and deactivation state, as described above. If the controlling element 1 is supplied via the control input 3 with an external control signal at the first signal level, the variable 10 is set to the value not equal to 0 if it previously had the value 0. If the value of the variable 10 was already not equal to 0, this value is retained.

As long as the variable 10 has the value not equal to 0, the controlling element 1 carries out its function. If, while carrying out the function, an external control signal 2 at the first signal level is once again supplied via the control input 3, the processing of the function is continued, and is not interrupted and restarted.

Once the function of the controlling element 1 has been completed, the variable 10 is set to the value 0, and the controlling element 1 is deactivated. An external control signal 5 which is at the second signal level is output via the control output 4 and leads to deactivation of those controlling elements to whose control inputs this external control signal is applied.

If a controlling element 1 is supplied via its control input 3 with an external control signal 2 which is at the second signal level, the variable 10 is set to the value 0 if it previously had a value not equal to 0. The processing of the function is then terminated. Irrespective of the previous value of the variable 10, an external control signal 5 which is at the second signal level is output via the control output 4 and leads to deactivation of those controlling elements to whose control inputs this external control signal is applied.

These controlling elements can be arranged in series or in parallel. In this case, the variables of a number of controlling elements may have a value not equal to 0. Their functions are then processed in parallel.

Figure 2:
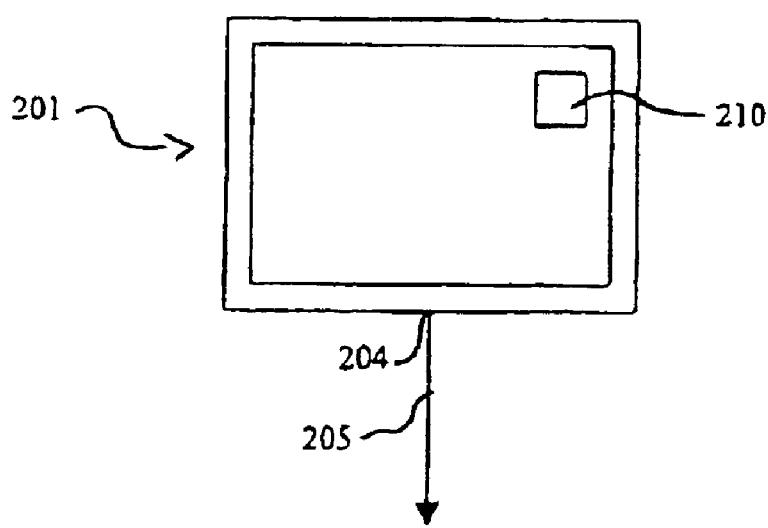

FIG. 2 shows a start element 201, which has no control input but only one control output 204, via which an external control signal 205 can be output. When these external control signal 205 is at the first signal level, other controlling elements can in consequence be activated, to a control input of which this external control signal is supplied.

As an alternative to the illustration in FIG. 2, the start element 201 may also be provided with a control input. Then, once an external control signal 205 at the first signal level has been output via the start element 201, the start element can be caused, via this control input, to output an external control signal 205 at the second signal level and thus to end the activation of all the controlling elements in a defined manner, by them in turn passing on this external control signal at the second signal level.

Figure 3:
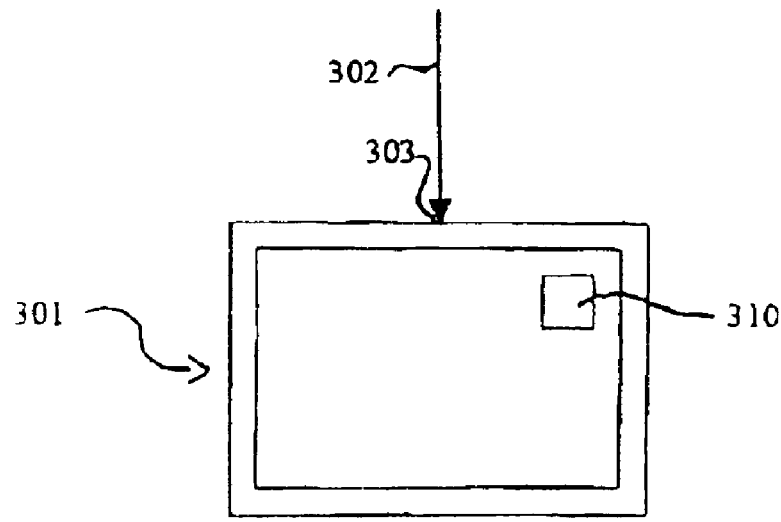

FIG. 3 shows a terminator element 301. Such a terminator element 301 is used to end a monitoring flow. This means that this terminator element 301 has an external control input 303 to which an external control signal 302 can be supplied. An external control signal 302 at the first signal level is "swallowed up" by this terminator element without it passing on any external control signal to other controlling elements.

Figure 4:
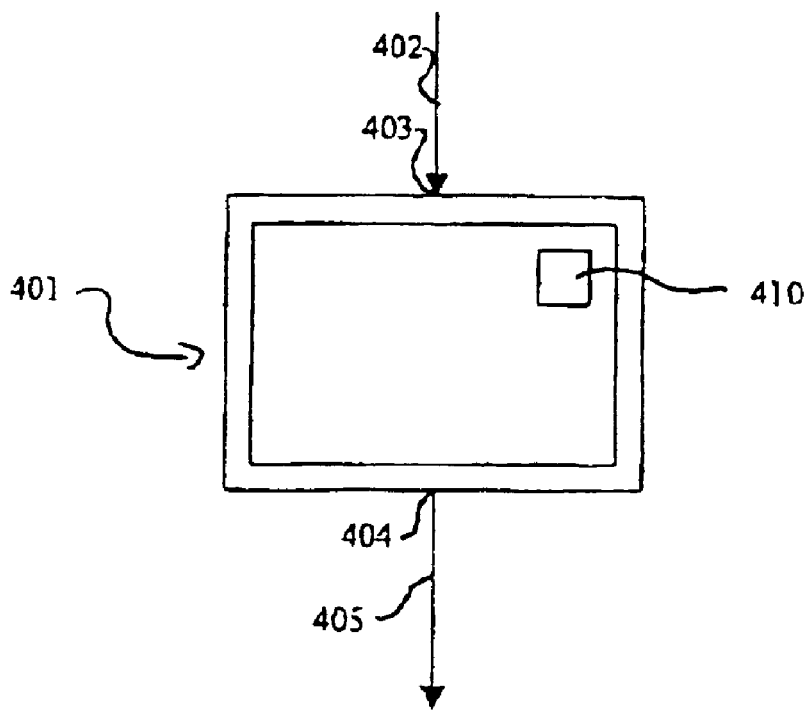

FIG. 4 shows an exit element 401, such as is used to end a monitoring flow. In contrast to a terminator element 301 corresponding to the illustration in FIG. 3, this exit element 401 is, however, connected to a start element. If the exit element 401 is supplied via its control input 403 with an external control signal 402 which is at the first signal level, this exit element outputs an external control signal 405 corresponding to the second signal level, via its control output 404, to the start element. This start element then immediately passes this external control signal on at the second signal level, so that all the controlling elements are deactivated. An exit element 401 thus ends a process initiated by a start element. If the exit element 401 is supplied with an external control signal at the second signal level, the external control signal is ignored.

Figure 5:
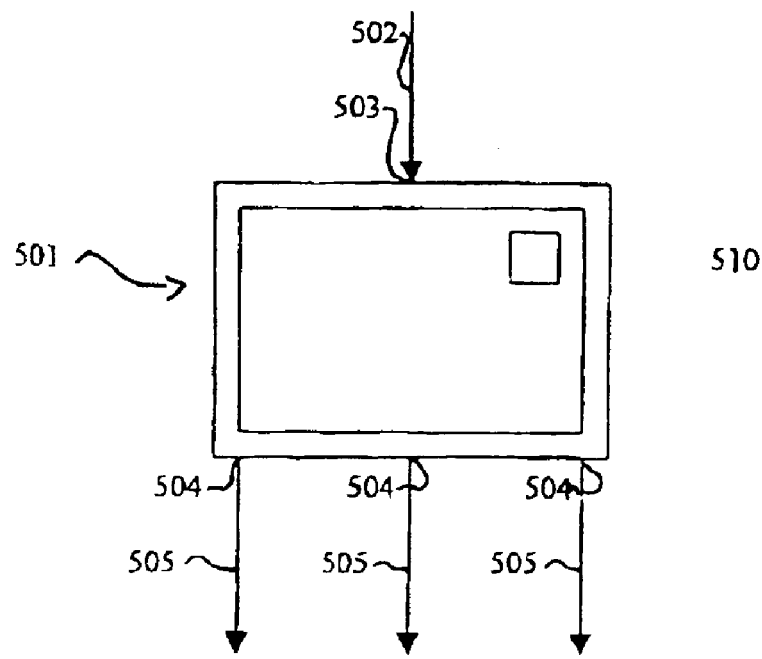

FIG. 5 shows a fork element 501 which is used to output an external control signal 502, which arrives via a control input 503, via a number of control outputs 504. This fork element 501 thus allows a number of other controlling elements to be activated or deactivated at the same time.

Figure 6:
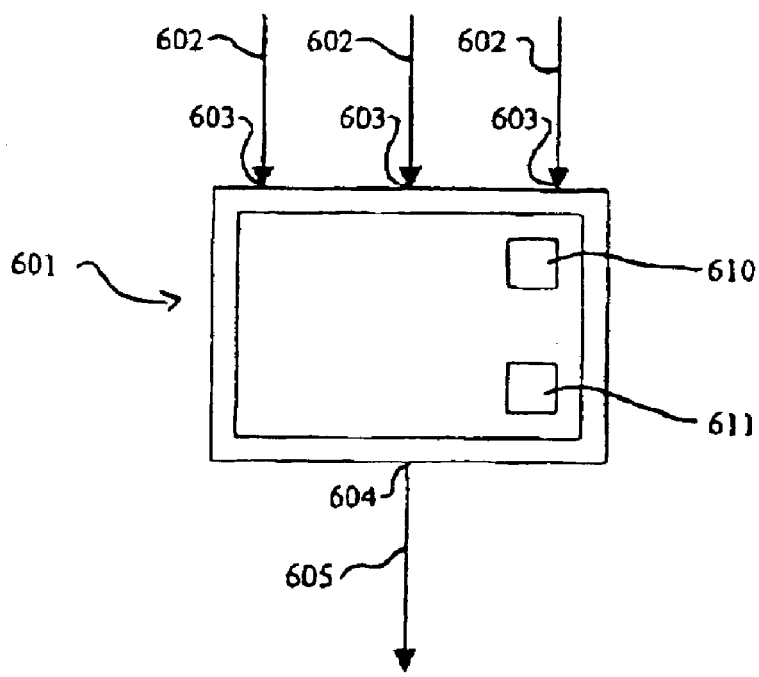

FIG. 6 shows a joint element 601. This joint element 601 has a number of control inputs 603, to each of which an external control signal 602 can be supplied. An external control signal 605 is derived therefrom and is output via the control output 604.

Furthermore, it can be seen from the illustration in FIG. 6 that a parameter 611 can be used to preset the way in which the external control signal 605 is derived from the incoming external control signals 602.

This may be done, for example, via a logic AND operation of the external control signals 602 at the control inputs 603. This means that an external control signal 605 at the first signal level is output via the control output 604 only when an external control signal 602 at the first signal level has been applied to each control input at least once.

The external control signal 605, which is output via the control output 604, can likewise also be provided via a logic OR operation. This means that an external control signal 605 at the first signal level is output via the control input 604 immediately when an external control signal 605 which is at the first signal level is applied to at least one of the control inputs 603. This likewise applies to passing on external control signals at the second signal level.

Figure 7:
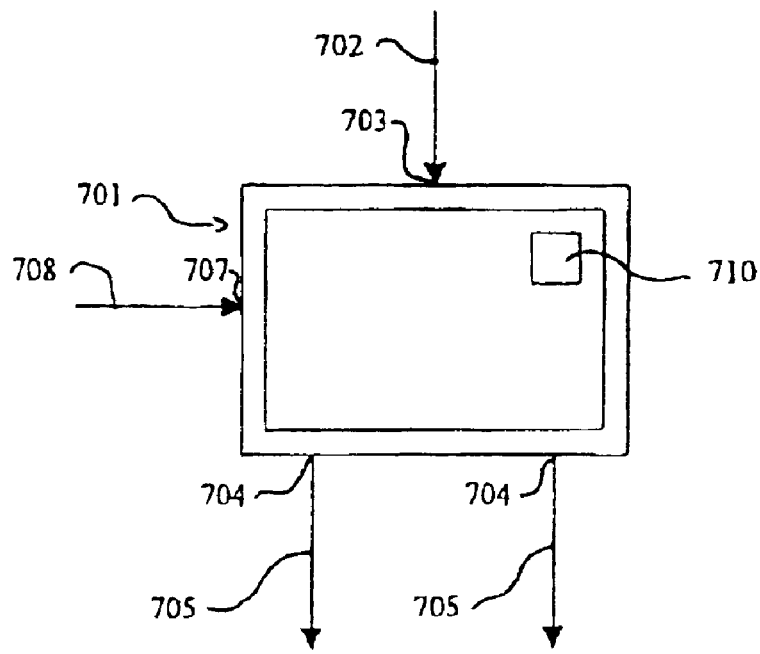

FIG. 7 shows a branching element 701. This branching element 701 can be supplied via a control input 703 with an external control signal 702. When this control signal 702 is at the first signal level, the variable 710 is set to the corresponding value, and the branching element 701 is activated. The data input signal 708 which is applied to a data input 707 is used to determine the external control output 704 via which the control signal 705 at the first signal level will be output.

The check on the basis of the data input signal 708 may be carried out, for example, as an "if-then-else" check with two control outputs 704. It is likewise possible to provide more than two control outputs 704 and to carry out the check on the basis of the data input signal 708 as a "select" check. This select check is then used to determine the control output 704 via which the external control signal 705 at the first signal level will be output.

Figure 8:
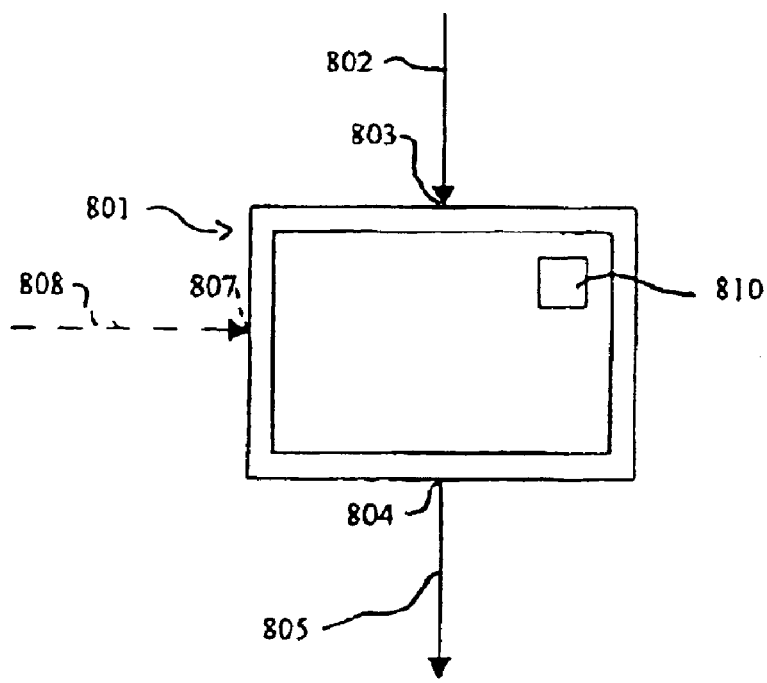

FIG. 8 shows a control element 801 whose function is to process a loop. This loop comprises a loop body and a loop condition. The loop body is carried out for as long as the loop condition is satisfied. The process of running the loop body from activation until its end is referred to as a run. If the condition is not satisfied, the loop is inactive. The condition is checked only at specific times. Certain loop types may differ, depending on the time of the check.

In what is referred to as an unconditional loop, a defined number of loop runs are carried out. The loop condition is satisfied provided the defined number of runs has not yet been reached. This is checked before each run. No further external data are required in order to decide whether the loop will or will not be run through. For this reason, the data input signal 808 and the data input 807 are represented by dashed lines in FIG. 8 since, in the case of unconditional loops, these are invariably required when it is necessary to access external data during the processing in the loop run.

What are referred to as conditional loops are also known. In the case of presumptive loops, the loop body is run through once before the loop condition is checked. The loop condition is then checked by evaluating at least one data input signal 808. In the case of non-presumptive loops, the loop condition is checked even before the first run. If this condition is not satisfied at the time when the loop is activated, no run through the loop is carried out at all.

In addition to these elements, which primarily control the monitoring flow by passing on appropriate control signals for activation and deactivation of other elements, data-processing elements are also provided. In these elements, data inputs and data outputs are provided for supplying data input signals and for emitting data output signals depending on the specific nature of the data processing.

The data may be variables which are continuous with respect to time. Data of this type have one value at each time.

Furthermore, the data may be time-discrete variables. Data of this type do not have a value in the narrow sense but represent an event in time. Time-discrete variables are thus referred to as "events".

Figure 9:
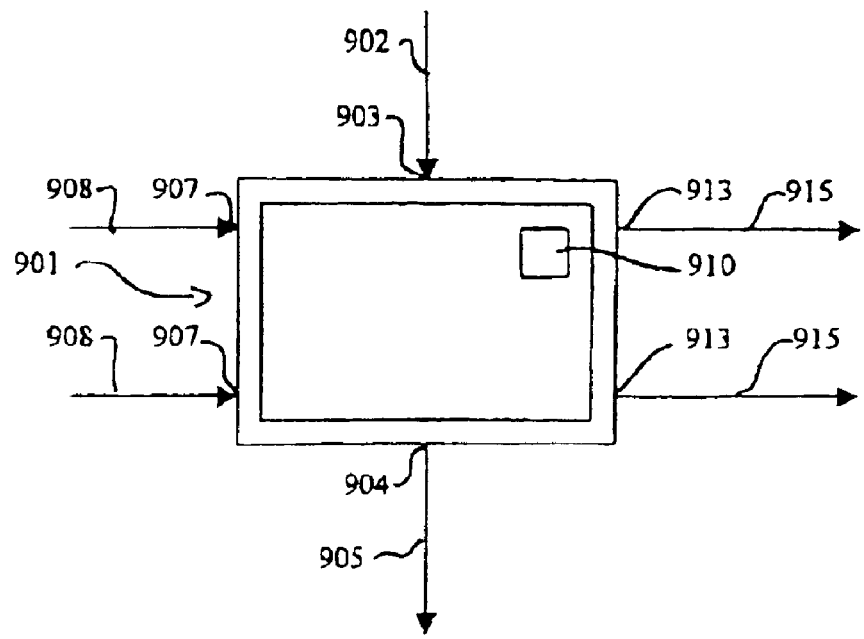

FIG. 9 shows a data-processing element 901. This element 901 has two data inputs 907, to each of which a data input signal 908 is supplied. Furthermore, this element 901 has two data outputs 903, via each of which a data output signal 915 can be output. Element 901 can carry out a simple assessment process, for example, as data processing. In this case, an incoming data input signal 908 is passed on as a data output signal 915 via at least one data output 913. In this case, it is possible for the element 901 to have only one data input and only one data output.

Furthermore, the element 901 may be in the form of a modifying element, processing incoming data input signals 908 to form one or more output variables, which are output as data output signals 915 via appropriate data outputs 913. These modifying elements may, for example, carry out mathematical operations, such as the arithmetic operations of addition, subtraction, multiplication and division. Furthermore, other operators may also be provided, such as integrators, differentiators or transcendental functions. The absolute value may likewise be formed, for example.

Such elements 901 terminate performance of their function when they are supplied with an external control signal 902 at the second signal level via the control input 903.

It is also possible to carry out Boolean operators by means of the data-processing elements 901. These Boolean algebra operators may, for example, be the NOT, AND, OR and XOR functions.

Comparison elements may likewise be provided, which compare two or more input variables 908 and produce the result of the comparison at the data output 913 by means of an appropriate data output signal 915. Comparison elements advantageously have an event output, which generates an event as soon as the comparison is true. By way of example, the following comparisons are feasible:

Equivalence: the incoming variables have the same value

Non-equivalence: the incoming variables have different values.

Greater than: the first value is greater than the second.

Greater than or equal: the first value is greater than or equal to the second value.

Less than: the first value is less than the second.

Less than or equal: the first value is less than or equal to the second value.

Within: the incoming value is between an upper and a lower limit.

Outside: the incoming value is outside a range specified by a lower and an upper limit.

Rising flank: the incoming value passes through a threshold from below upwards.

Falling flank: the incoming value passes through a threshold from above downwards.

Furthermore, data-processing elements may be in the form of storage elements. These storage elements each have an event and a value input. They process the value as soon as an event is present at their event input. The following processing operations for storage elements can be provided:

Buffer: the buffer stores the value of the incoming value as often as an event is present at the event input.

Minimum-value memory: the minimum-value memory contains the minimum observed value.

Maximum-value memory: the maximum-value memory contains the maximum observed value.

Mean-value memory: the mean-value memory contains the mean value of the observed value.

For minimum-value memories, maximum-value memories and mean-value memories, it is also advantageously possible to define whether the storage process is intended to be carried out over all values, the last n values or the last t seconds.

Figure 10:
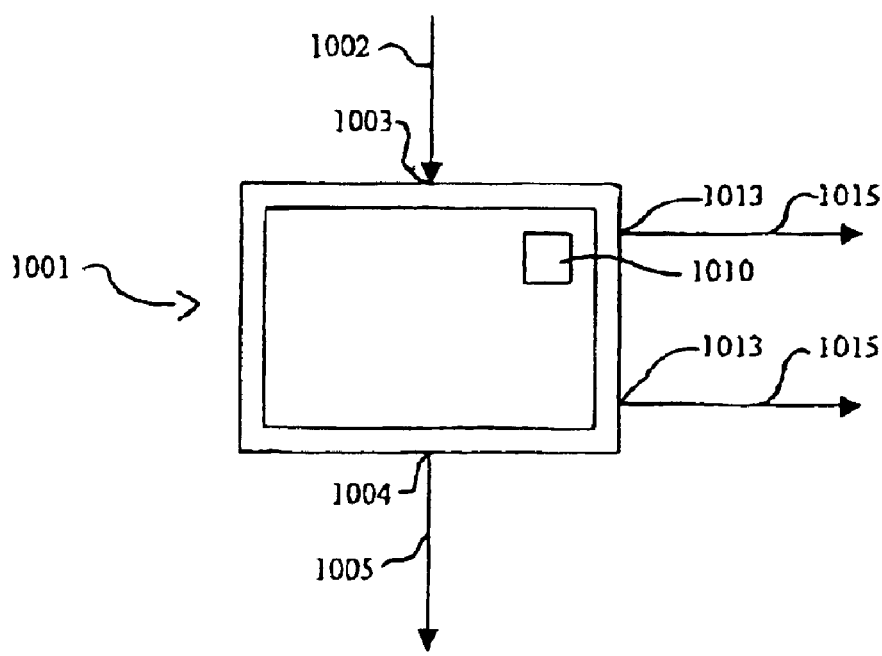

FIG. 10 shows a time-related element 1001, which may, for example, be in the form of a timeout. In this case, when a preset time t has elapsed, an event is triggered and the element 1001 is deactivated with an external control signal 1005 at the second level being emitted. The value-related and/or event-related data output signals 1015 may be output via the data outputs 1013. It is likewise possible to provide only one data output 1013.

Figure 11:
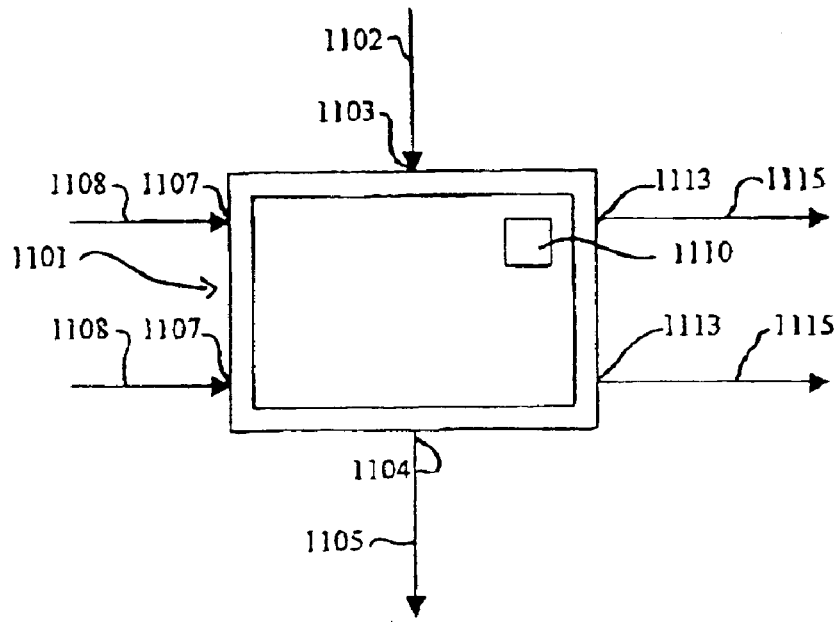

FIG. 11 shows a time-related element 1101, which operates as a timer. The time-related element 1101 is used to measure the time between two events. The measurement starts with an event which is supplied as a data input signal 1108 via one of the data inputs 1107. The time measurement ends with a further event, which is supplied as a data input signal 1108 to the other data input 1107 of the element 1101. It is likewise also possible to provide only one data input 1107 and to supply the two data signals 1108, which define the start and the end of the time interval to be measured, via a data input 1107.

The timer may, for example, have two data outputs 1113. The measured time may be output as a data output signal 1115 at a value-related data output. Furthermore, the element 1101 may generate an event and output this as a data output signal 1115 via a further data output 1113. After completion of the measurement, the element 1101 is deactivated, with an external control signal 1105 at the second signal level being emitted.

Figure 12:
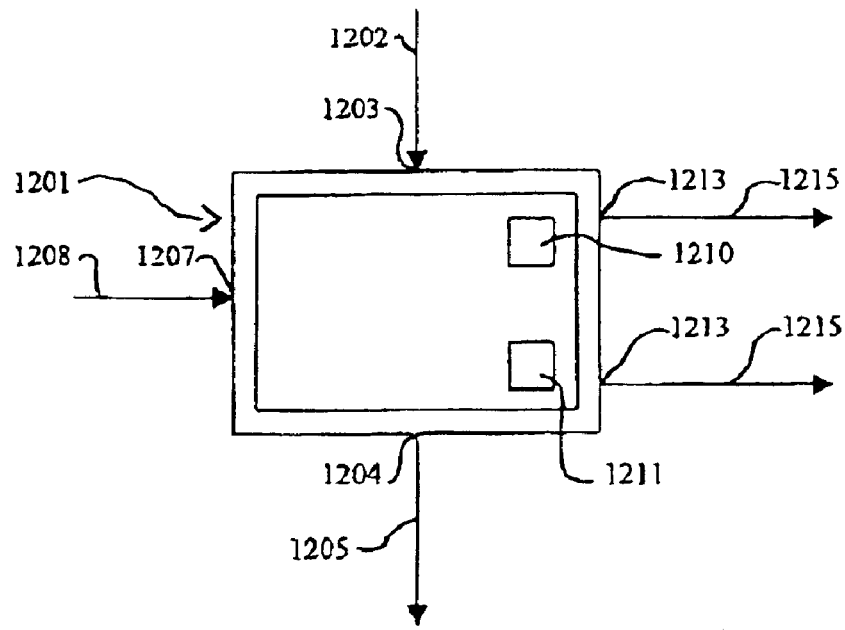

Furthermore, event-related elements (which react to events) may be provided, such as a countdown element 1201 illustrated in FIG. 12. For each event which arrives via the data input 1207 and is represented by the data input signal 1208, the countdown element 1201 decrements a preset counter from the value n to the value 0. When the count 0 is reached, the countdown element 1201 itself triggers an event, which is output as a data output signal 1215 via one of the two illustrated data outputs 1213. Furthermore, the countdown element 1201 is deactivated, with an external control signal at the first signal level also being output via the control input 1204 as an external control signal 1205. The value n may, for example, be preset via the parameter 1211.

In contrast to the illustration shown in FIG. 12, it is also possible to provide only one data output 1213.

Figure 13:
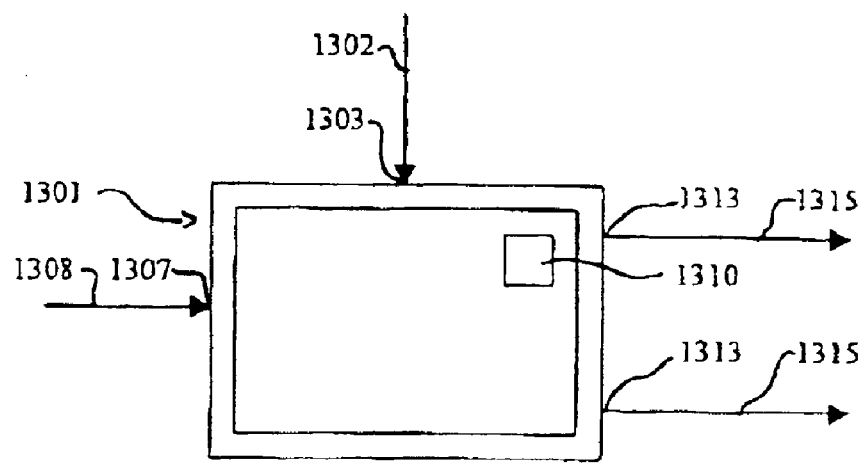

FIG. 13 shows a counter element. Once it has been activated via an external control signal 1302 at its control input 1303, this element counts the events which are supplied as the data input signal 1308 to the data input 1307 of the counter element 1302. The number of events is then output via the data outputs 1313 as the data output signal 1315. Once it has been activated via the external control signal 1302 at the first signal level, the counter element 1301 counts the events until an external control signal 1302 at the second signal level is supplied to the counter element 1301. In this case as well, it is also possible to provide only one data output 1313.

Figure 14:
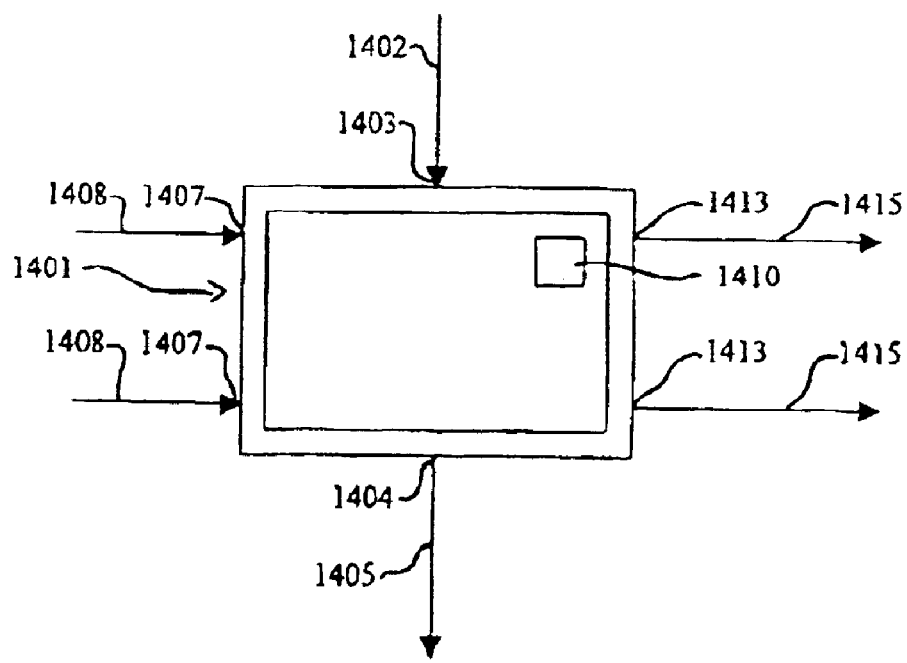

FIG. 14 shows a guardian element 1401, which monitors two data inputs 1407 to determine which of them first has a data input signal 1408 that represents an event applied to it. When such a data input signal 1408 which represents an event is present, a corresponding data output signal 1415 is output at the data outputs 1413. This data output signal 1415 is event-related. The guardian element 1401 likewise produces an event, which is output as a data output signal 1415. The guardian element 1401 is then deactivated, with an external control signal at the first signal level being output via the control output 1404. Such a guardian element 1401 makes it possible to monitor for coincident occurrences of time-related and/or event-related processes. In this case as well, only one data output 1413 can once again be provided.

Figure 15:
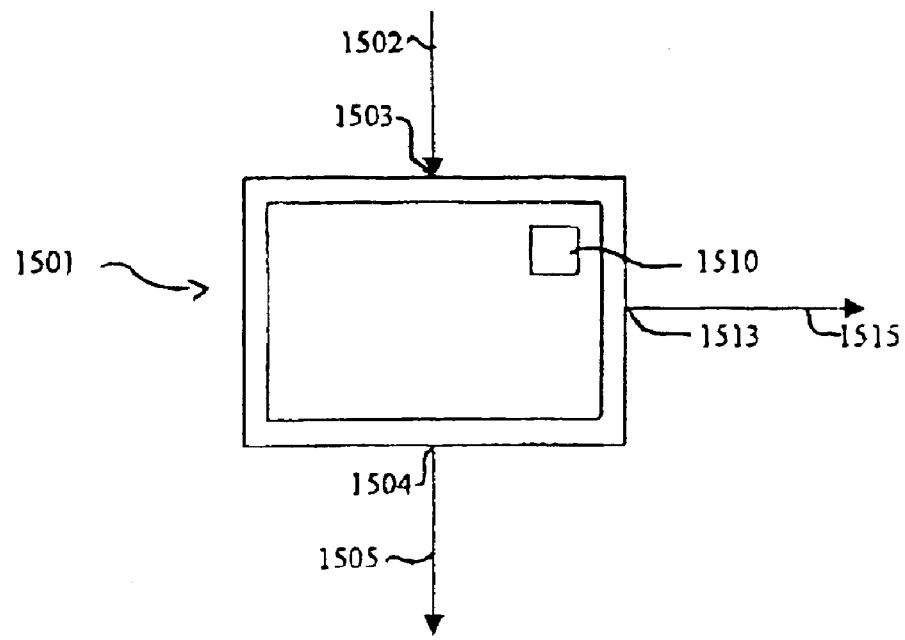
Figure 16:
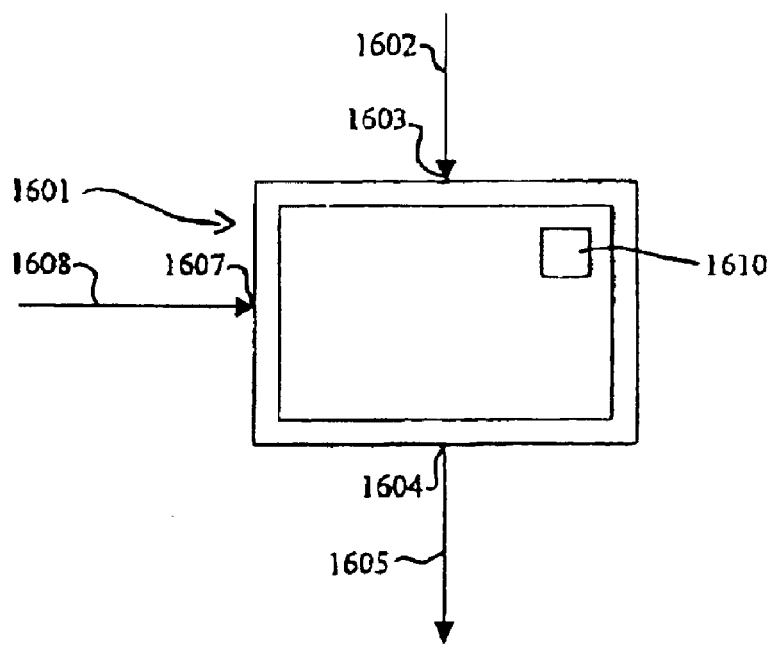

FIGS. 15 and 16 show converter elements, which allow control signals to be converted to event-related data signals, and vice versa.

FIG. 15 shows an event generator element 1501 that element produces an event-related data output signal 1515 at its data output 1513 when an external control signal 1502 at the first signal level is applied to its control input 1503. This external control signal 1502 is passed on directly via the control output 1504 as the external control signal 1505.

FIG. 16 shows a synchronization element 1601, which passes on an external control signal 1502 at the first signal level as the external control signal 1605 via the control output 1604 only when a specific event-related data input signal 1608 is applied to its data input 1607.

Figure 17:
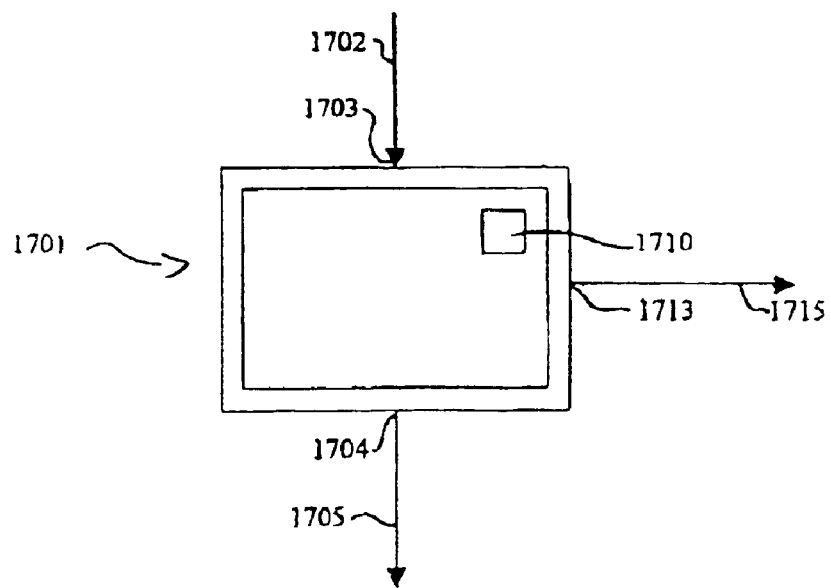

FIG. 17 shows a signal generator element 1701. This element allows signal profiles to be produced with respect to time. The signal generator element is deactivated when the signal profile has been played out completely or when an external control signal 1702 at the second signal level is supplied to the signal generator element 1701 via its control input 1703. Signal profiles are themselves once again described by specialized signal elements, and a distinction can be drawn between three signal elements:

A signal profile comprises various segments which follow one another in time.

A segment is described by a logic element.

A logic element interconnects one or more signal generator elements.

A signal generator element produces a value which varies with time.

Figure 18:
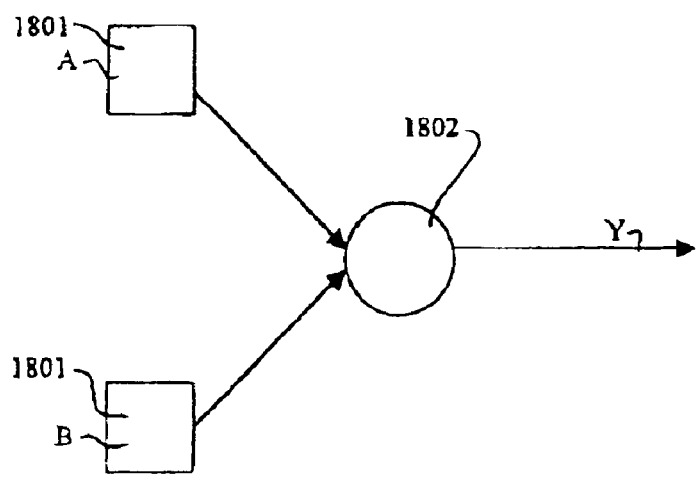
FIGS. 18 and 19 show an arrangement of elements for providing combined functions.

A logic element is characterized by one or more slots 1801 into which signal generator elements 1802 can be inserted, as shown in FIG. 18. The slots 1801 are linked via one or more operations, which define the logic process. Complex profiles can thus be produced at the output Y of the logic element 1802 from elementary signal functions. In particular, logic operations are defined for the following operations:

Addition: Y=A+B

Subtraction: Y=A−B

Multiplication: Y=A×B

Division: Y=A/B; B=0 in this case, then Y assumes the maximum positive value which can be represented if A>0, and the maximum negative value which can be represented when A<0.

MAC: Y=A×B+C

Furthermore, filters can be provided:

Low-pass filter: the output Y is produced from the low-pass-filtered signal A. The cut-off frequency of the low-pass filter is governed by the signal B.

High-pass filter: the output Y is produced from the high-pass-filtered signal A. The cut-off frequency of the high-pass filter is governed by the signal B.

Bandpass filter: the output Y is produced from the bandpass-filtered signal A. The cut-off frequencies of the bandpass filter are governed by signals B and C.

Bandstop filter: the output Y is produced from the bandstop-filtered signal A. The cut-off frequencies of the bandstop filter are governed by the signals B and C.

It can be seen from the described examples that the logic element 1802 can also be supplied with more than two variables, if required.

A signal generator element produces a value which varies with time. A library of prefabricated generator elements can advantageously be accessed for this purpose. These generator elements are configurable. The following elements can advantageously be defined:

Sine: Y=A+sin (w*t+b); with the amplitude A, the circular frequency w and the phase b.

Cosine: Y=A* cos (w*t+b); with the amplitude A, the circular frequency w and the phase b.

Exponential function: y=exp (A*t)

Constant: Y=const.

Pulse train: Y is a sequence of pulses of duration $T_{pulse}$ and with the period time $T_{period}$.

PWM: Y is a sequence of pulses with the duty ratio $T_{ratio}$ and the period duration $T_{period}$.

Ramp: Y is a ramp from A to B with the gradient M.

Measurement data: in this case, Y is not determined analytically but is taken from a previously recorded set of measurements. It is thus possible to reproduce profiles measured in reality.

Figure 19:
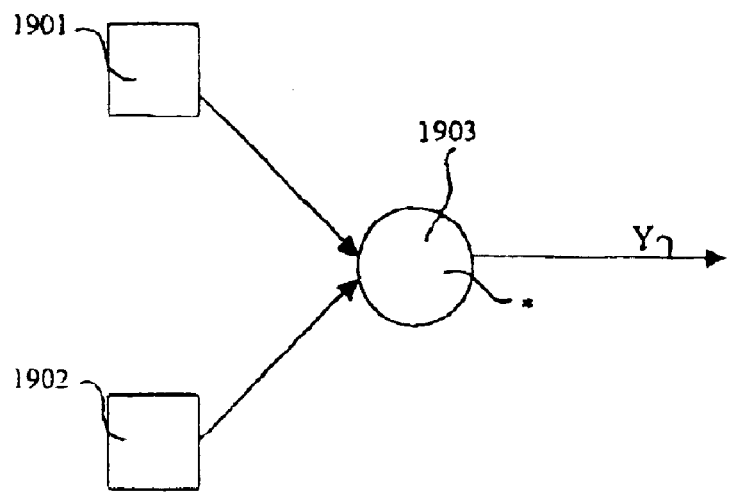

The example illustrated in FIG. 19 allows, for example, a knocking signal from a knocking sensor of an internal combustion engine to be simulated. This signal is characterized by a decaying sinusoidal oscillation. The effect can be described by the equation $Y = A * \exp(-c*t) * \sin(w*t)$. The resultant signal Y can be produced by the logic operation 1903 of multiplication and the signal generators 1901 for the exponential function and 1902 for the sinusoidal function.

Figure 20:
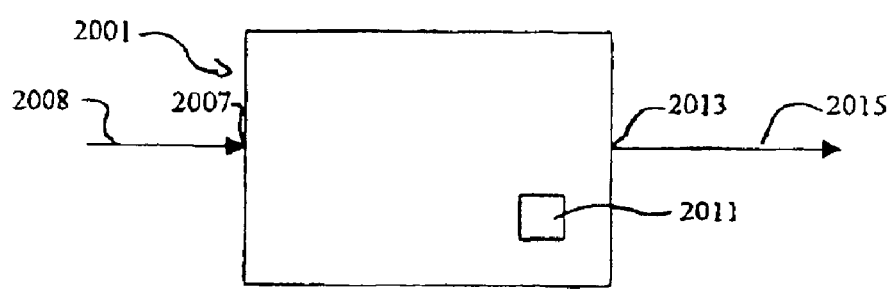
FIG. 20 shows a data-storage element.

Furthermore, storage elements 2001 can be provided. Storage elements are not included in the control signal flow. They have only data signals. One example is illustrated in FIG. 20. These storage elements 2001 do not have a variable corresponding to the other elements and have no "active" or "deactivated" state.

The storage elements 2001 illustrated in FIG. 20 can essentially occur in two forms.

Sources: sources have no input and one output. The stored variable is produced at this output, for further processing.

Sinks: sinks receive variables for storage. The stored variable can be called up at any time via a corresponding source.

Sources access a memory area and provide the variable stored there at their output.

For example, a constant, which does not vary with time, can be produced at the output.

Likewise, such a source may also be in the form of a signal source which accesses signals which vary with time of the program or test system and provide these signals to the controlling elements. The available signals are then predetermined by the program or test system.

Furthermore, the source may also be defined as a variable source. Variable sources supply the value of a variable memory which contains a value which varies with time. In contrast to signals, variables may be freely defined.

In contrast, sinks receives variables and store them in a memory location.

Signal sinks store the incoming variable in a signal provided by the program or test system. The available signals are predetermined by the test system.

Variable sinks store the incoming variable in a variable memory which can be freely defined.

Figure 21:
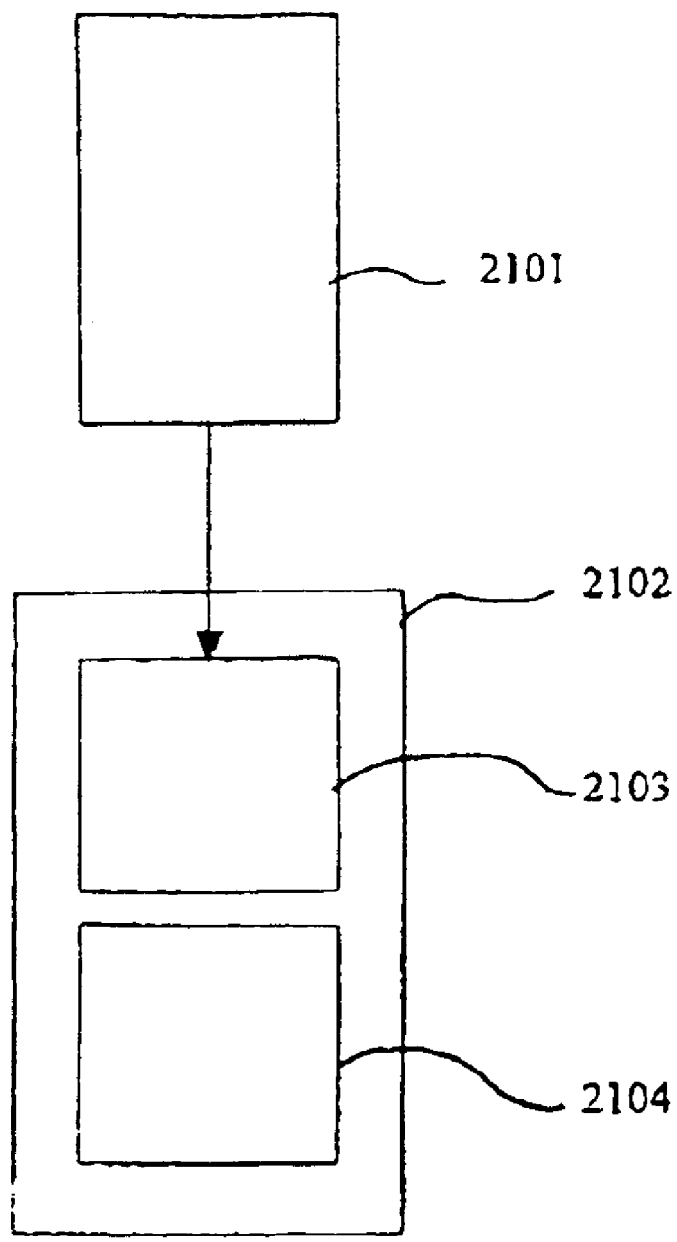
FIG. 21 illustrates the production of a list by means of which the elements can be linked.

FIG. 21 shows the fundamental structure of a test system 2102 according to the invention, with the capability for test automation. A (software) component is integrated in the test system 2012 and, as a part of the test system 2012, is responsible for carrying out the test descriptions 2101. This component is referred to in the following text as the test machine 2103. Its structure will be described in more detail in the following text.

The essential idea of the test machine 2103 is to map the elements described above onto corresponding data structures, which are used by an algorithm, based on two modules, an element module and a management module.

In the element module, one module forms the basis for each respective element; Data structures are defined for each element to be represented and the program code required to initialize and carry out the respective element. The data structures and the associated code for a particular element are referred to as the element class. A data structure provided with specific data and related to one element is referred to as an element object. The procedure for producing a new element object is referred to as instantiation of an element object.

The management module, on the other hand, manages all the element modules. Data structures defined in the management module are referred to, together with the associated code, as the management class. A data structure of a management class filled with specific data is referred to as a management object. The procedure for producing a new management object is referred to as instantiation of a management object.

The element classes of the element module and the management classes of the management module will be described in the following text.

The element classes defined in the element module are organized hierarchically, and are related to one another by means of a relationship which is referred to as "derivation". Derivation means that all the data fields (referred to as "attributes" in the following text) are provided for a class derived from a basic class, and all the program functions (referred to as "methods" in the following text) are provided for this basic class. Furthermore, the derivation process is able to vary the methods, that is to say to modify the behaviour implemented in the method.

Like the elements themselves, the element classes can also be distinguished on the basis of controlling and storage element classes. The elements are, however, based on a common basic class. This class has two methods:

The constructor: a method which initializes the attribute of a newly produced element object. This method is called up directly after production.

GetValue: the method is called up by a linked element object in order to check the value of an outgoing data flow. The data flow carries are variable which is continuous with time.

HasEvent: the method is called up by a linked element object in order to check the presence of an event in an outgoing data flow. The data flow carries a time-discrete variable.

Controlling and storage element classes will be described in the following text.

All the controlling element classes are based on a common basic class for controlling element classes. This class contains attributes which are required for carrying out a controlling element object. These include, in particular, data fields for the location (variable), which indicates whether the controlling element object is active.

The class furthermore contains methods which are required for producing and for carrying out the controlling element objects. The methods can be subdivided into a control interface and a process interface.

The control interface of a controlling element object provides information about its state, and can influence this state. These are, in particular:

IsActive: this method provides information as to whether the relevant element module is active, that is to say is carrying out its function. A characteristic feature of activity is the attribute associated with the variable.

ProcessMark: the method is called up when the element object receives a changed value for the variable. The variable can in this case be changed both in such a manner that it corresponds to the active state and such that it corresponds to the deactivated state.

If the variable changes its value in the direction of activation, then a distinction is drawn between the following situations:

The variable previously had a value corresponding to deactivation. The variable is then changed appropriately and the OnStart method is called up.

The variable already had a value corresponding to activation. There is no reaction.

If the variable changes its value in the direction of deactivation, then a distinction is drawn between the following situations:

The variable previously had a value corresponding to activation. The value of the variable is then changed appropriately, and the OnTerminate method is called up. A corresponding external control signal is passed to all the outgoing control outputs.

The variable previously had a value corresponding to deactivation. In this case, the external control signal is passed on to all the outgoing control outputs.

RequestControl: the method is used by a subsequent element object in order to monitor a control output for the presence of a corresponding external control signal. If a corresponding external control signal is present, then this external control signal is transferred to the caller, and is deleted at the relevant output.

OnStart: the method is called up whenever the element object changes from the inactive state to the active state, and initializes all the data fields required to carry out the function.

OnTerminate: the method is called up whenever the element object changes from the active state to the inactive state.

The process interface is used to carry out the function implemented by the element object. Specifically, it has the following methods:

Update: this method is called up cyclically by a management object. The method monitors and controls the state of the element object by using the control interface methods. The algorithm implemented in Update operates as follows:

The control input is monitored for the presence of any external control signals at the first signal level. If a corresponding control signal is present, then this is processed using ProcessMark. It can then change the value stored in the variable.

If the element object is active after the above step, then the Process method described in the following text is called up. The state can once again be changed in this method.

Process: this method is called up by Update for as long as an element object is identified as being active. The task of the element object is carried out within this method. In order to allow use in an environment with a real-time capability, this method must be implemented with a minimum amount of computation time. The method is normally implemented such that only one short computation step is in each case carried out within the task. To this end, complex tasks are implemented as a clocked automatic state process.

All storage element classes are based on a common basic class for storage element classes. In contrast to controlling element classes, storage element classes have only one control interface. This comprises only the redefinition of the following inherited methods:

The constructor: a method which initializes the attributes of an a newly produced element object. This method is called up immediately after production.

GetValue: the method is called up by a linked element object in order to check the value of an outgoing data flow. The data flow carries a variable which is continuous with time.

HasEvent: the method is called up by a linked element object in order to check the presence of an event at an outgoing data output. The data output outputs a time-discrete variable.

Furthermore, one, and only one, management class is defined. This declares the following lists as attributes:

List of all currently available element objects. This list represents the currently loaded test program.

List of all currently active element objects. This list represents the active elements in the test program.

These lists are provided with element objects as data in a management object. The provision of data for the list of currently available element objects is referred to as "programming the test machine". The programming is carried out via appropriate methods in the management class. The list, with all the data provided in it, thus contains the test program.

When the test machine has been programmed, the program can be run. An appropriate management object method is called up for this purpose. This commences the run by starting with the first element object in the list of all currently available element objects. This is done by transferring into the list of active elements. The element object is then active and carries out its task. The element objects dependent on it monitor its control outputs and are activated as appropriate. The program is processed completely when there are no more active element objects and the list of active elements is also empty.

To allow a management object to be used in an environment with a real-time capability, it has an update routine which can be called up cyclically. This processes all the active element objects once in each cycle.

The methods for the management class are as follows:

Construct: the constructor initializes all the fields in the management object produced immediately before this.

Init: the method initiates the program and prepares the management object for renewed programming.

AddElement: a new element object is added to the list of available element objects.

Update: one computation step is carried out in all the active element objects.

Start: the program is started.

Terminate: the program is ended.

An example will be explained once again in the following text. The intention here is to monitor a signal S, provided by the test system. The signal S is intended to assume the value "1" within 500 ms. If S exhibits this behaviour, then the test has been carried out successfully and the result should then be "good". If the 500 ms elapses without S assuming the value 1, then the test has been carried out unsuccessfully. The result should then be "bad".

Figure 22:
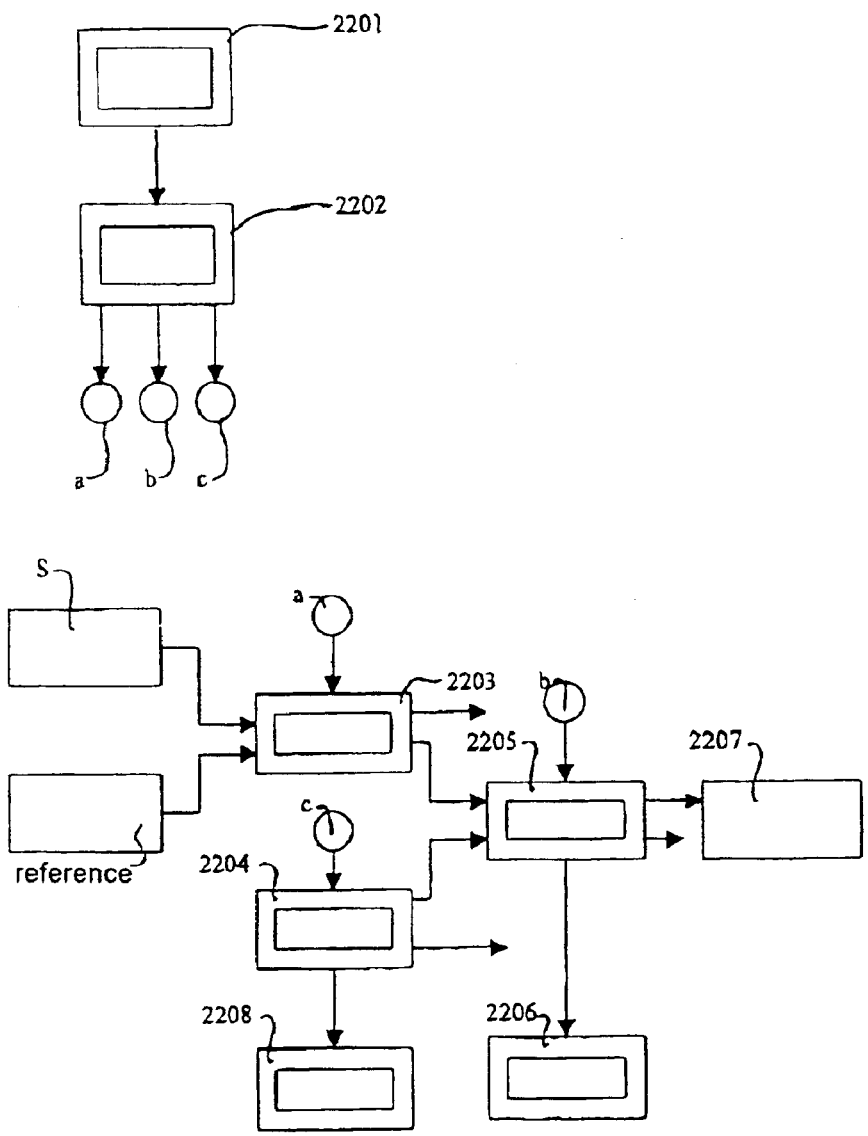
FIG. 22 shows an example of a linking process for carrying out a simulation.

This test can be provided from the elements described above as illustrated in FIG. 22.

Starting with the start element 2201, the running process branches via the fork element 2202 into three parallel-running elements a, b and c. While the comparison element 2203 compares the signal value S with the reference value 1 and waits for this condition to occur, the timeout element 2204 counts down the quoted time. At the same time, the guardian element 2205 monitors whether the condition becomes true first of all, or the timeout element times out. In the former case, the guardian element sets its output to "good", otherwise to "bad". In both cases, the guardian element will output an external control signal at the first signal level to the downstream exit element 2206. This will then stop the entire process by sending an external control signal at the second signal level to the start element 2201. The "result" variable 2207 can be used to check whether the test was carried out successfully.

In this case, the deactivation of the timeout element 2204 in the monitoring flow does not lead to any further run since the downstream terminator element 2208 destroys the external control signal at the first signal level. The values of outgoing data flows which are not connected are not required and decay.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An element for carrying out and documenting a program or test sequence, wherein:
   the element is configured to perform a particular function for carrying out said program or test sequence, wherein, said particular function comprises at least one function selected from the group consisting of mathematical or logic operations, time detection or analysis, comparisons, signal analyses, signal range detection, threshold detection, maximum, minimum, mean or final value detection and sequence monitoring and control;
   the element has at least one control input to which an external control signal can be supplied;
   a variable in the element can be varied as a function of the external control signal; and
   a process for carrying out said particular function can be varied by the element in response to a value of said variable, in such a manner that,
   when the variable has one value and the external control signal is at a first signal level, the variable assumes a specific value which differs from said one value; and
   when the variable is at that specific value and an external control signal which is at the first signal level is once again applied, that the variable remains at that specific value.

2. The element according to claim 1, wherein
   the variable is reset when the element has finished carrying out the particular function; and
   when the variable is reset, the element outputs an external control signal, which is at the first signal level, via at least one control output of the element.

3. The element according to claim 1, wherein
   said one value is zero and the specific value which differs from said one value is nonzero;
   the variable assumes the value "0" when the at least one control input of the element is supplied with an external control signal which is at a second signal level, with an external control signal which is at the second signal level then being output via at least one control output of the element.

4. The element according to claim 1, wherein the element has a control input and a number of control outputs, with the external control signal being output from the element via all control outputs.

5. The element according to claim 1, wherein the element has a number of control inputs, with an external control signal which is at the first signal level being output via the at least one control output when a control signal which corresponds to the first signal level is applied to all control inputs.

6. The element according to claim 1, wherein the element has a number of control inputs, with an external control signal which is at the first signal level being output via the at least one control output when a control signal which corresponds to the first signal level is applied to at least one control input.

7. The element according to claim 1, wherein the element has one control input and at least one control output as well as at least one data input, with an external control signal, which is applied to the control input and is at the first signal level, being output via that control output which is determined by the function of the element as a function of the signal which is applied to the at least one data input.

8. The element according to claim 1, wherein:
   the element has at least one data input and at least one data output;
   the particular function comprises formation of at least one data output signal at said at least one data output from the at least one data input signal which are applied to at least one data input; and
   the at least one data output signal is output via said at least one data output.

9. The element according to claim 1, wherein the particular function of the element is a time measurement.

10. The element according to claim 9, wherein the time measurement is carried out by measuring a specific time period starting from the beginning of one of an application of an external control signal at the first signal level, an application of a specific signal at a data input, or an application of a signal combination at a number of data inputs of the element, with one of an external control signal at the first signal level being output at the end of the time period via a control output of the element, and/or a corresponding data signal being output at one or more data outputs.

11. The element according to claim 1, wherein a time signal profile is output as a data output signal via a data output when the external control signal is at the first signal level.

12. The element according to claim 1, wherein said particular function comprises one of monitoring and data processing.

13. A system for implementing a program or test sequence, comprising:
   an element which implements a particular function which is included in said program or test sequences, wherein said particular function comprises at least one function selected from the group consisting of mathematical or logic operations, time detection or analysis, comparisons, signal analyses, signal range detection, threshold detection, maximum, minimum, mean or final value detection and sequence monitoring and control;
   the element has at least one control input to which an external control signal can be supplied;
   a variable in the element can be varied as a function of the external control signal; and
   a process for carrying out said particular function can be varied by the element in response to a value of said variable, in such a manner that,
   when the variable has one value and the external control signal is at a first signal level, the variable assumes a specific value which differs from said one value;
   when the variable is at that specific value and an external control signal which is at the first signal level is once again applied, that the variable remains at that specific value.

14. The element according to claim 13, wherein said particular function comprises one of monitoring and data processing.

15. A method for documenting a program or test sequence using an element which implements a particular function in response to a value of a variable stored in said element, wherein the element has at least one control input to which an external control signal can be supplied, and the variable stored in the element can be varied as a function of the external control signal, said method comprising:

- when the variable has one value and the external control signal is at a first level, causing the variable to assume a specific value which differs from said one value; and
- when the variable is at that specific value and an external control signal which is at the first signal level is once again applied, causing the variable to remain at the specific level;
- wherein said particular function comprises at least one function selected from the group consisting of mathematical or logic operations, time detection or analysis, comparisons, signal analyses, signal range detection, threshold detection, maximum, minimum, mean or final value detection and sequence monitoring and control.

16. The element according to claim 15, wherein the variable is reset when the element has finished carrying out the particular function; and when the variable is reset, the element outputs an external control signal, which is at the first signal level, via at least one control output of the element.

17. The element according to claim 15, wherein the specific value is zero and the value which differs from the specific value is nonzero;

the variable assumes the value "0" when the at least one control input of the element is supplied with an external control signal which is at a second signal level, with an external control signal which is at the second signal level then being output via at least one control output of the element.

18. The element according to claim 15, wherein said particular function comprises one of monitoring and data processing.

* * * * *